United States Patent
Wang et al.

(10) Patent No.: US 7,123,057 B2
(45) Date of Patent: Oct. 17, 2006

(54) SELF-BIASED COMPARATOR WITH HYSTERESIS CONTROL FOR POWER SUPPLY MONITORING AND METHOD

(75) Inventors: Binan Wang, Tucson, AZ (US); Paul Stulik, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/465,303

(22) Filed: Jun. 19, 2003

(65) Prior Publication Data

US 2004/0257120 A1    Dec. 23, 2004

(51) Int. Cl.
*H03K 5/22* (2006.01)
(52) U.S. Cl. ............................ 327/65; 327/563; 327/66
(58) Field of Classification Search ................. 327/54, 327/55, 57, 63–65, 67, 563, 108, 112, 534, 327/537, 66; 326/83
See application file for complete search history.

(56) References Cited

U.S. PATENT DOCUMENTS

| | | | |
|---|---|---|---|
| 5,534,800 A * | 7/1996 | Hiraki et al. | 327/57 |
| 6,066,966 A * | 5/2000 | Kuo | 327/55 |
| 6,483,353 B1 * | 11/2002 | Kim et al. | 327/55 |
| 6,501,320 B1 * | 12/2002 | Le | 327/57 |

* cited by examiner

*Primary Examiner*—Long Nguyen
(74) *Attorney, Agent, or Firm*—W. James Brady; Frederick J. Telecky, Jr.

(57) ABSTRACT

A voltage monitor circuit for biasing a well region of a CMOS circuit includes a self-biased comparator which compares first (INP) and second (INN) input signals. The comparator includes first (MN1) and second (MN2) N-channel transistors with grounded sources, a drain of the first N-channel transistor and a gate of the second N-channel transistor being coupled to a first output (OUTN), and a drain of the second N-channel transistor and a gate of the first N-channel transistor being coupled to a second output (OUTP). First (MP1) and second (MP2) P-channel transistors are operated to couple the second or first input signal to the second or first output, respectively, by controlling the gate-to-source voltage of the first or second P-channel transistor according to the polarity of a voltage difference between the first and second input signals.

14 Claims, 9 Drawing Sheets

SELF-BIASED COMPARATOR WITH HYSTERESIS CONTROL FOR POWER SUPPLY MONITORING AND METHOD

BACKGROUND OF THE INVENTION

The present invention relates generally to supply voltage monitoring circuits for use in detecting that of two supply voltages is higher in an integrated circuit containing circuitry which otherwise can be damaged if the two supply voltages are increased or "powered up" in the wrong sequence. More particularly, the invention relates to monitoring and switching circuitry that automatically connects the N-type well regions of P-channel transistors to the higher of the two or more supply voltages.

In a mixed-signal system, i.e., a system including both digital signals and analog signals, it is common for the associated digital circuitry and analog circuitry to be powered by separate power supply voltage sources having different voltage levels, for example 5 volts for the analog circuitry and 3.3 volts for the digital circuitry. However, often the digital circuitry that interfaces with the mixed-signal system is powered by a 5 volt supply voltage. The 3.3 volt digital input/output circuitry of the mixed-signal system must be "tolerant" to the 5 volt digital signals received from the above-mentioned external digital circuitry. That is, the 5 volt digital signals must not damage the 3.3 volt digital input/output circuitry. Translation buffer circuits can be used that translate the 5 volt output signals produced by such digital circuitry to the 3.3 volt level required by the digital circuitry in the mixed-signal system. However, use of such translation buffer circuits involves additional cost. In order to accomplish this, the 3.3 volt digital circuitry in the mixed-signal system must be powered by a 5 volt supply.

FIG. 1A shows a schematic view of a typical 3.3V I/O cell 10 which is connected to a generalized I/O cell control circuit. In I/O (input/output) cell 10 the bulk terminal BP and the source terminal SP of a P-channel output driver transistor 13 are connected to a 3.3V digital power supply voltage DVDD. The drain terminal DP of transistor 13 is coupled to a static protection device and to an I/O pad and also to the drain terminal DN of an N-channel transistor 14, the bulk terminal BN and source terminal SN of which are connected to ground.

FIG. 1B shows a cross-sectional view of I/O cell 10 formed in a P-type substrate 12. N-channel transistor 14 has its source and drain comprised of two N-type regions NP formed in substrate 12, the gate of transistor 14 being designated by GN. Electrical contact to P-type substrate 12 is accomplished through heavily doped contact region PP designated by reference numeral 12A. An N-type "well" region 11 is formed in substrate 12, and P-channel transistor 13 is formed by two P-type regions PP formed in well region 11. N-type well region 11 constitutes the bulk terminal of P-channel transistor 13. Electrical contact to well region 11 is accomplished by a heavily doped N-type region NP designated by reference numeral 11A. PN junctions that are formed by the P-type source and drain regions PP of transistor 13 and the N-type well region 11 constitute the two parasitic PN junction diodes D1 and D2, respectively.

I/O cell 10 is not tolerant to a 5 volt input signal applied to the I/O pad because the parasitic diode D1 will become forward-biased every time the I/O pad voltage rises above the DVDD level of 3.3 volts. The forward-biasing of parasitic junction diode D1 will not only conduct a large amount of current through it but it may also cause latch-up and/or permanent damage to the I/O cell. As is well-known to those skilled in the art, integrated circuit structures often include parasitic bipolar transistors that interact in a regenerative fashion to switch a parasitic latch circuit into a high-current mode as a result of forward-biasing of a parasitic PN junction. The resulting high current may damage the integrated circuit. In any case, the parasitic latch device can be switched off so as to eliminate the high current only by removing power from the circuit before turning the power back on to continue operation of the circuit.

Referring to FIG. 1C and the corresponding integrated circuit sectional view in FIG. 1D, in order to make the 3.3V I/O cell 10A tolerant to a 5 volt input, N-type well 11 must be at the 5 volt supply level AVDD to avoid forward biasing parasitic diode D1, and this can be accomplished by simply connecting the bulk terminal BP of transistor 13 to the 5 volt analog power supply AVDD. However, this connection requires the user to turn on the analog supply voltage AVDD before the digital supply voltage DVDD during the power-up sequence, and also to turn off the digital supply DVDD before the analog supply AVDD during the power-down sequence. If the foregoing power-up and power-down sequences are not observed, parasitic junction diode D2 will become forward-biased, causing it to conduct a large amount of current through the diode D2, and may also cause latch-up and/or permanent damage to I/O cell 10. The foregoing restriction on the power-up sequence and power-down sequence of the analog and digital power supply voltages limits the convenience of using the dual supply mixed-signal system of FIG. 1C. In a system wherein the sequence of activating power supply voltages cannot be readily controlled, the usefulness of the circuit shown in FIG. 1C is limited. To remove this restriction, it is necessary to have a circuit to keep N-type well 11 at the higher of the two power supply voltages at all times.

FIG. 1E shows a 3.3 volt I/O cell 10B with the bulk terminal BP of the P-channel output driver transistor 13 connected to a monitor circuit 15 which monitors both the 3.3 volt digital supply DVDD and the 5 volt analog supply AVDD and outputs the higher of the two supply voltages to the bulk terminal BP of transistor 13. In I/O cell 10B the parasitic PN junction diodes D1 and D2 can never become forward-biased. I/O cell 10B therefore is "5 volt tolerant" and imposes no restriction on the AVDD and DVDD power-up and power-down sequences A prior art implementation of monitor circuit 15 of FIGS. 1E and 1F for keeping the N-type well region 11 at the higher of two power supply voltages VA and VB is shown in FIG. 2. The circuit includes cross-coupled P-channel transistors MP1 and MP2 having their drains connected to VABMAX conductor 15A. The gate of transistor MP1 and the source of transistor MP2 are connected to VB, and the gate of transistor MP2 and the source of transistor MP1 are connected to VA. In this circuit, if VA is larger than VB by at least one threshold voltage VTP of the transistor MP1 then VABMAX will be connected to VA through transistor MP1 and similarly, if VB is greater than VA by at least VTP, then VABMAX will be connected to VB through MP2. By connecting the N-type well region(s) 15 of the P-channel transistors in the input/output circuitry of a mixed-signal integrated circuit, the N-type well region 11 will be maintained at the higher of VA and VB. Unfortunately, the circuit of FIG. 2 exhibits a "dead-zone" of VTP volts and does not function effectively if one of the two supply voltages VA and VB is not greater than the other by at least VTP volts.

FIG. 3 shows another prior art implementation of supply voltage monitor circuit 15 of FIGS. 1E and 1F for maintaining the N-type well region 11 at the higher of VA and VB. Supply voltage monitor circuit 15 includes a conventional comparator 20, outputs of which are connected to gates of P-channel transistors MPD1 and MPD2, the drains and bulk electrodes of which are connected to conductor 15A. The sources of transistors MPD1 and MPD2 are connected to VA and VB, respectively. In the circuit of FIG. 3, if the supply voltage VA is turned on first to a voltage level that is high enough for the bias current generator to function properly, then the output voltage VABMAX on conductor 15A will select the higher of the VA and VB supply voltages without exhibiting a dead-zone such as that in the circuit of FIG. 2. However, the supply voltage monitor circuit of FIG. 3 has the disadvantage that the supply voltage VA must be turned on first before the comparator circuitry therein can function properly, because if VB is turned on first, the comparator 20 does not function and the circuit operation is equivalent to that of the circuit of FIG. 2.

Thus, there is an unmet need for a power supply voltage monitoring/control circuit that automatically connects an N-type well region of a CMOS integrated circuit to the highest of a plurality of supply voltages provided in the integrated circuit.

There is another unmet need for a power supply voltage monitoring/control circuit that automatically connects an N-type region or substrate of an integrated circuit to the highest of a plurality of supply voltages provided in the integrated circuit with minimum restriction on the magnitudes of the power supply voltages and the sequences in which the various power supply voltages must be turned on and off.

There is another unmet need for a power supply voltage monitoring/control circuit that continuously automatically connects an N-type well region of a CMOS integrated circuit to the highest of a plurality of supply voltages provided in the integrated circuit.

There is another unmet need for a power supply voltage monitoring/control circuit that avoids producing a "dead zone" in which the higher of a plurality of supply voltages is not reliably connected to an N-type well region of a CMOS integrated circuit.

There is another unmet need for a power supply voltage monitoring/control circuit that avoids the need users predetermined sequences to power up and power down multiple supply voltages applied to an integrated circuit.

There is another unmet need for a power supply voltage monitoring/control circuit that operates reliably irrespective of the magnitude of voltage differences between various supply voltages utilized in an integrated circuit including the monitoring/control circuit.

SUMMARY OF THE INVENTION

Accordingly, it is an object of the present invention to provide a power supply voltage monitoring/control circuit that automatically connects an N-type well region of a CMOS integrated circuit to the highest of a plurality of supply voltages provided in the integrated circuit.

It is another object of the invention to provide a power supply voltage monitoring/control circuit that automatically connects an N-type region or substrate of an integrated circuit to the highest of a plurality of supply voltages provided in the integrated circuit with minimum restriction on the magnitudes of the power supply voltages and the sequences in which the various power supply voltages must be turned on and off.

It is another object of the present invention to provide a power supply voltage monitoring/control circuit that continuously automatically connects an N-type well region of a CMOS integrated circuit to the highest of a plurality of supply voltages provided in the integrated circuit.

It is another object of the present invention to provide a power supply voltage monitoring/control circuit that continuously automatically connects or reconnects an N-type region or substrate of an integrated circuit to the highest of a plurality of supply voltages provided in the integrated circuit even for a relatively low voltage difference between the highest and next-highest supply voltages.

It is another object of the present invention to provide a power supply voltage monitoring/control circuit that avoids producing a "dead zone" in which the higher of a plurality of supply voltages is not reliably connected to an N-type well region of a CMOS integrated circuit.

It is another object of the present invention to provide a power supply voltage monitoring/control circuit that avoids the need to power up and power down multiple supply voltages applied to an integrated circuit according to predetermined sequences.

It is another object of the invention to provide a power supply voltage monitoring/control circuit having a predetermined amount of hysteresis that continuously automatically connects an N-type well region of a CMOS integrated circuit to the highest of a plurality of supply voltages provided in the integrated circuit Briefly described, and in accordance with one embodiment, the present invention provides a voltage monitor circuit for biasing a well region of a CMOS circuit including a self-biased comparator which compares first (INP) and second (INN) input signals. The comparator includes first (MN1) and second (MN2) N-channel transistors with grounded sources, a drain of the first N-channel transistor and a gate of the second N-channel transistor being coupled to a first output (OUTN), and a drain of the second N-channel transistor and a gate of the first N-channel transistor being coupled to a second output (OUTP). First (MP1) and second (MP2) P-channel transistors are operated to couple the second or first input signal to the second or first output, respectively, by controlling the gate-to-source voltage of the first or second P-channel transistor according to the polarity of a voltage difference between the first and second input signals. In one embodiment, a self-biased comparator circuit (20) includes first (INP) and second (MNN) inputs, first (OUTP) and second (OUTN) outputs and a reference voltage conductor (GND), first (MN1), second (MN2), third (MN3) and fourth (MN4) N-channel transistors and first (MN3) and second (MN4) current sources, first (MP1) and second (MP2)P-channel transistors, and first (MP3) and second (MP4) level shifters. The sources of the first (MN1) and second (MN2) N-channel transistors are coupled to the reference voltage conductor (GND), a gate of the first (MN1) N-channel transistor is coupled to the first output (OUTP), a drain of the second N-channel transistor (MN2) and a drain of the second P-channel transistor (MP2), and a gate of the second (MN2) N-channel transistor is coupled to the second output (OUTN), a drain of the first N-channel transistor (MN1) and a drain of the first P-channel transistor (MP1). The source and a bulk electrode of the third P-channel transistor (MP3) and a source and a bulk electrode of the second P-channel transistor (MP2) are coupled to the first input (INM), a source and a bulk electrode of the fourth P-channel transistor (MP4) and a source and a bulk electrode of the first P-channel transistor (MP1) are coupled to the second input (INN), a first conductor (n1) is coupled to a gate of the first P-channel transistor (MP1), a gate and a drain of the third P-channel transistor (MP3), and a first terminal of the first current source (MN3), a second conductor (n2) is coupled to a gate of the second P-channel transistor (MP2), a gate and drain of the fourth P-channel transistor (MP4), and a first terminal of the second current source (MN4), and a second terminal of the first current source and a second terminal of the second current source are coupled to the reference voltage conductor. In the described embodiments, the first and second level shifters include third (MP3) and fourth (MP4) P-channel transistors, respectively, and the first current source includes a third N-channel transistor (MN3) having a source coupled to the reference voltage conductor, a gate coupled to the gate of the first output (OUTP) and a drain coupled to the first conductor (n1), and the second current source includes a fourth N-channel transistor (MN4) having a source coupled to the reference voltage conductor, a gate coupled to the gate of the second output (OUTN) and a drain coupled to the second conductor (n2).

In one embodiment, the self biased comparator is included in a voltage monitor circuit (15) including a first voltage input (VA), a second voltage input (VB), and a voltage output (VABMAX). A first P-channel drive transistor (MPD1) has a source coupled to the first voltage input (VA) and the first input (INP), a gate coupled to the second output (OUTN), and a source and a bulk electrode coupled to the voltage output (VABMAX). The second P-channel drive transistor (MPD2) has a source coupled to the second voltage input (VB) and the second input (INN), a gate coupled to the first output (OUTP), and a source and a bulk electrode coupled to the voltage output (VABMAX), wherein the output voltage (VABMAX) is equal to the greater of the first (VA) and second (VB) voltage inputs.

In one embodiment, a CMOS integrated circuit avoids forward biasing of parasitic PN junctions by using the voltage monitor circuit to bias N-type regions at the highest supply voltage coupled to the CMOS integrated circuit.

DETAILED DESCRIPTION OF THE PREFERRED EMBODIMENTS

The invention provides several new self-biased comparator circuits and several supply voltage monitor circuits that include any of the new comparator circuits. The new supply voltage monitor circuits are utilized to bias a N-type well region of an integrated circuit to prevent forward biasing of parasitic PN junctions during power-up sequencing of multiple power supply voltages connected to the integrated circuit.

Figure 4:
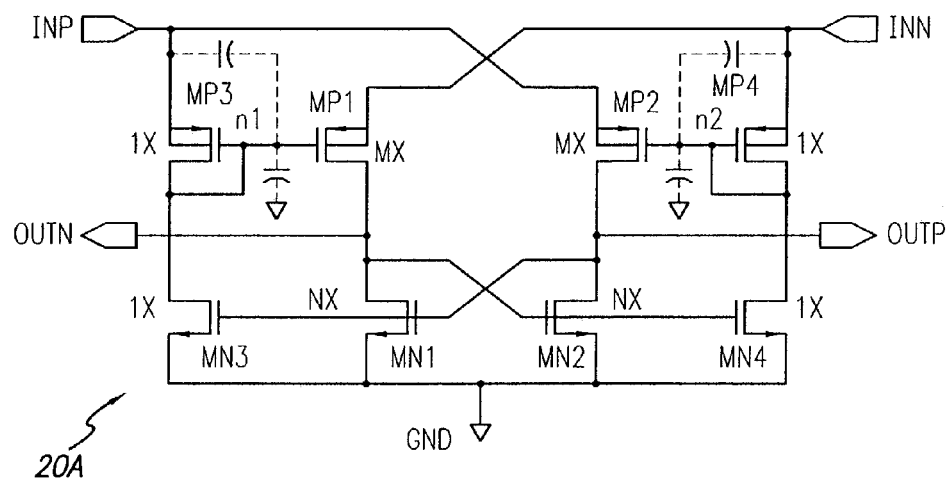
FIG. 4 is a schematic diagram of a basic self-biased comparator circuit of the present invention.
Figure 5:
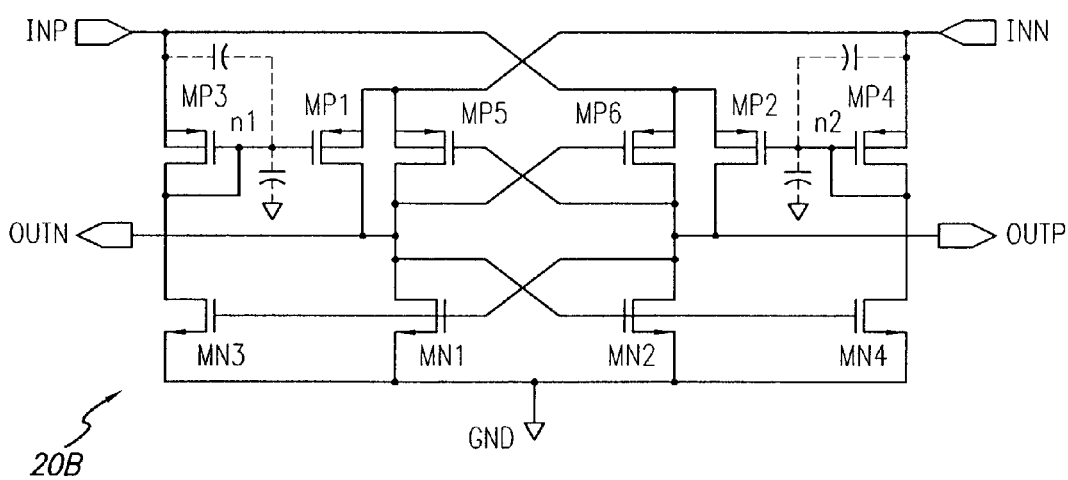
FIG. 5 is a schematic diagram of an improved version of the self-biased comparator circuit of FIG. 4.
Figure 6:
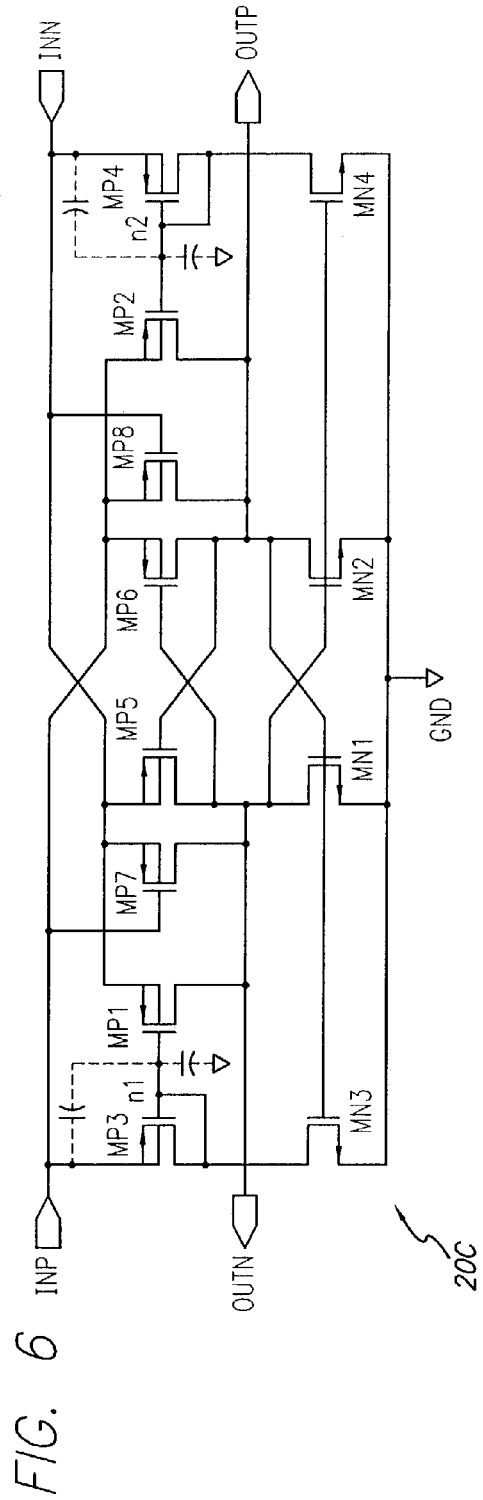
FIG. 6 is a schematic diagram of a further improved version of the self-biased comparator circuit of FIG. 5.
Figure 7:
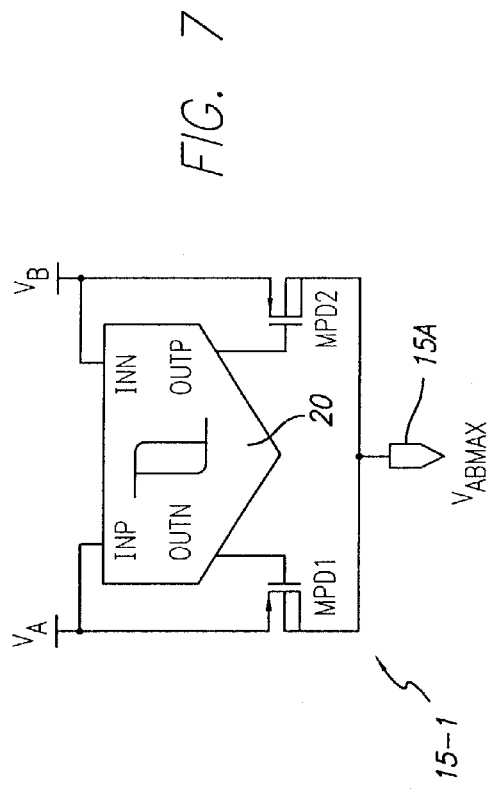
FIG. 7 is a diagram of an improved monitor circuit of the present invention.
Figure 8:
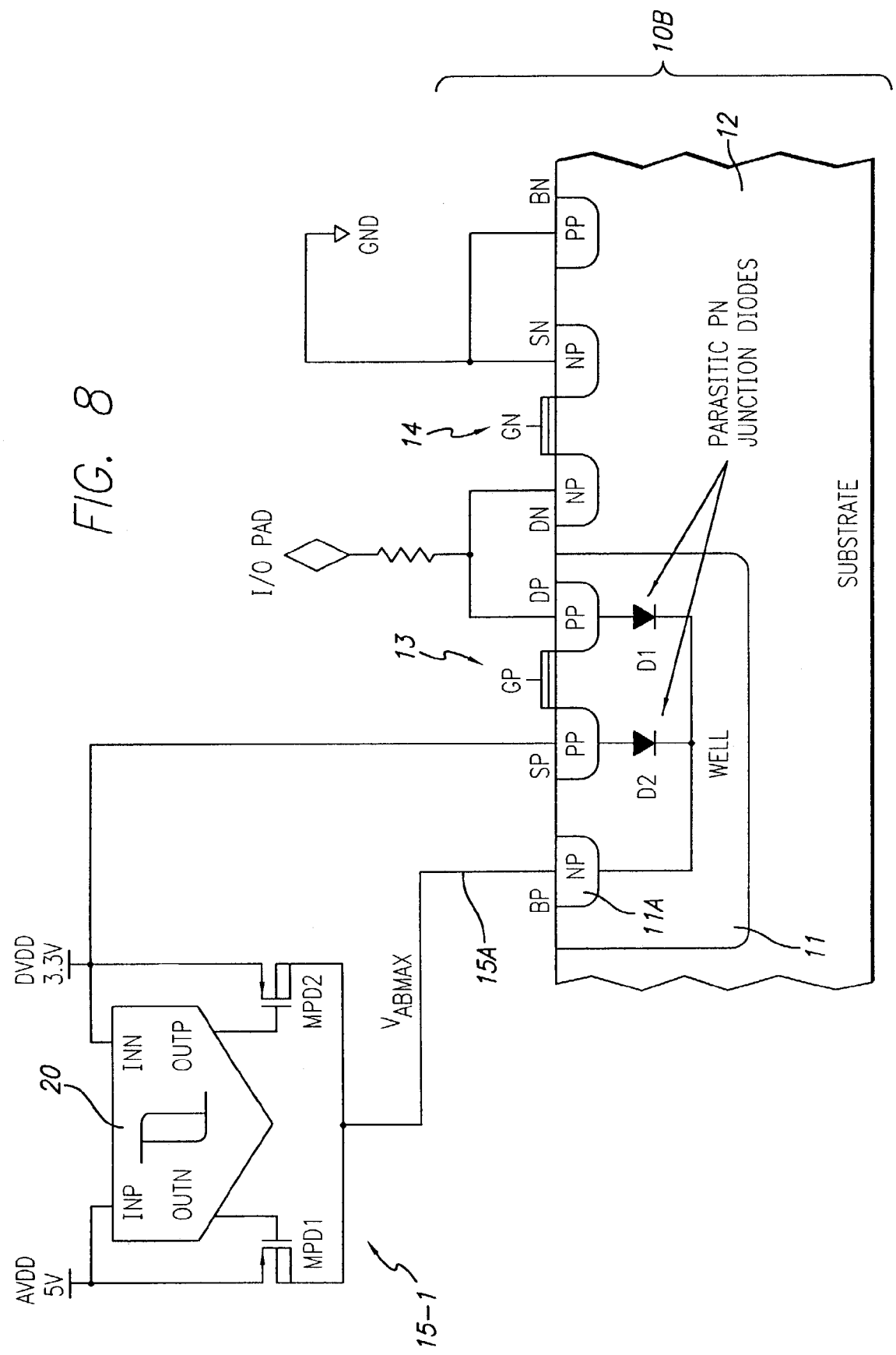
FIG. 8 is a hybrid diagram of the monitor circuit of FIG. 7 and the structure of an integrated circuit implementation of the I/O cell in FIG. 1E.

FIG. 4 shows a basic self-biased comparator circuit 20A, and FIGS. 5 and 6 show modified versions 20B and 20C, respectively, of the basic comparator 20A with additional features. FIG. 7 shows a supply voltage monitor circuit 15-1 that includes any of the comparators of FIGS. 4–6 and functions to select the higher of two supply voltages VA and VB and applies the higher of the two supply voltages via conductor 15A as an output voltage VABMAX to be used to bias an N-type well region. FIG. 8 shows the supply voltage monitor circuit 15-1 of FIG. 7 with its output voltage VABMAX applied via conductor 15A to bias the N-type well region 11 of the integrated circuit I/O cell shown in FIG. 1F.

The basic self-biased comparator circuit 20A of FIG. 4 has two input terminals INP and INN, two output terminals OUTN and OUTP, and a ground power supply rail GND. Since comparator 20A is self-biased, the input terminals INP and INN also function as its power supply terminals. INP is connected to the source and bulk electrodes of a P-channel transistor MP3, the gate and drain of which are connected to both the drain of an N-channel transistor MN3 and the gate of a P-channel transistor MP1. INP also is connected to the source and bulk electrodes of a P-channel transistor MP2, the gate of which is connected by a conductor n2 to the gate and drain of a P-channel transistor MP4. INN is connected to the source and bulk electrodes of transistor MP4 and to the source and bulk electrodes of transistor MP1. The source of transistor MN3 is connected to ground, and its gate is connected to the gate of an N-channel transistor MN1 having its source connected to ground. The drain of transistor MN1 is connected to OUTN, the drain of transistor MP1, and the gate of an N-channel transistor MN2 and the gate of an N-channel transistor MN4, both of which have their sources connected to ground. The drain of transistor MN2 is connected to the gates of transistors MN1 and MN3, the drain of transistor MP2 and to OUTP. Parasitic capacitances on conductors n1 and n2 are indicated by dashed lines.

The operation of comparator 20A is described next. Comparator 20A starts functioning as soon as the voltage of one of INN and INP exceeds the threshold voltage VTP of the P-channel transistors MP1–MP4. If the input terminal INP is at a higher voltage than input terminal INN, then output terminal OUTP follows the voltage of input terminal INP while the output terminal OUTN is maintained at a low voltage level. If the input terminal INN is at a higher potential than input terminal INP, then output terminal OUTN follows input terminal INN while the output terminal OUTP is at a low voltage level.

The illustrated parasitic capacitances associated with conductor n2 tend to keep its voltage low when INN is held at 0 volts, so transistor MP2 turns on when the voltage of INP ramps up if INN is maintained at 0 volts. In a worst-case situation, conductor n2 is limited in how far positive it can go (when INN is maintained at ground) by the forward biasing of a parasitic PN junction diode formed by the N-type source region of transistor MP4 and the N-type well region in which that source region is formed. In any case, transistor MP2 is guaranteed to turn on when INP reaches the sum of the approximately 0.6 volt forward bias voltage of the above-mentioned parasitic diode plus the threshold voltage of transistor MP2.

In order to understand the details of the comparator operation, assume that initially both inputs INN and INP are at zero volts and input INP then ramps up to 2 volts. As INP exceeds VTP, transistor MP2 turns on and pulls OUTP up to the voltage level of MNP. This causes transistors MN1 and MN3 to turn on. With transistor MN3 turned on, bias current is established in the branch formed by transistors MP3 and MN3, which in turn establishes the voltage level of conductor n1 near ground. Transistor MP1 is in its off state since the voltage of its source is near ground. Output terminal OUTN is kept near zero volts by transistor MN1, which is turned on. Since OUTN is near zero volts, transistors MN2 and MN4 are turned off.

Assuming next that input INP remains constant at 2 volts and input INN ramps up from 0 volts to (for example) 3 volts. As INN approaches 2 volts, transistor MP1 starts to turn on. Since transistor MN1 is also turned on, a current path from INN to ground is established in the branch formed by transistors MP1 and MN1. As INN increases, the current through transistors MP1 and MN1 increases and the voltage of OUTN also increases. As the voltage of OUTN increases, transistor MN2, which starts to turn on, begins to pull the voltage of OUTP lower, which causes transistor MN1 to start turning off. As the voltage of INN increases past 2 volts (assuming a hysteresis of zero volts), the positive feedback action in the latch formed by transistors MN1 and MN2 causes OUTP to approach zero volts and causes OUTN to approach the voltage of INN.

The hysteresis of self-biased comparator 20A of FIG. 4 is controlled by choosing appropriate W/L ratios (i.e., channel-width to channel-length ratios) between transistors MN1 and MN3 (or transistors MN2 and MN4), and by choosing appropriate W/L ratios between transistors MP1 and MP3 (or transistors MP2 and MP4). If the W/L ratios of transistors MN3 and MP3 (or MN4 and MP4) are denoted as 1X, then the hysteresis of the comparator is controlled by choosing the correct W/L ratio multiplicative factors M for MP1 (MP2) and N for MN1 (MN2), as indicated in FIG. 4. Thus, the W/L ratios of transistors MP1 and MP2 are denoted as MX, and the W/L ratios of transistors that MN1 and MN2 are denoted as NX. Usually, the multiplicative factors M and N are chosen to be at least 10, as the 1X sized transistors are designed to be a small as possible in order to minimize power consumption. If N>M then comparator 20A will exhibit positive hysteresis. If M=N, then comparator 20A will have zero hysteresis. In this case, the transfer function of comparator 20A is such that OUTP is equal to INP if INP is greater than INN but otherwise is equal to zero volts, and is such that OUTN is equal to INN if INN is greater than INP but otherwise is equal to zero volts. An advantage of the invention is that positive hysteresis is usually insured by merely ensuring that the ratio N/M exceeds 1. In the described embodiments, the ratio of N to M was chosen to be approximately 2.

If N<M then comparator 20A will exhibit negative hysteresis. Negative hysteresis is generally undesirable for power supply monitoring applications because if INP and INN are within the negative hysteresis region, then the outputs OUTP and OUTN comparator 20A may oscillate. For example, if INP is at 2 volts, and the amount of hysteresis is +0.1 volts, then INN would have to increase to 2.1 volts in order to cause comparator 20A to change state. More generally, the voltage of one of INP and INN must exceed the voltage of the other by at least the amount of positive hysteresis in order to cause the comparator to switch. This is important because if the amount of hysteresis is negative, the comparator may tend to oscillate. Note that if the two power supply voltages, when established, have very similar levels that differ by less than the positive hysteresis of the comparator, the one that is established first will be the "winner", but no switching of the comparator will occur when the other one is established even if it is slightly higher. However, this is not problematic because the small voltage difference between the two supply voltages in this case is not large enough to cause any parasitic PN junction to become forward biased.

Reliable operation of the basic self-biased comparator 20A of FIG. 4 is assured as long as the final established voltage difference between INP and INN is larger than one threshold voltage of PMOS transistor MP2 (or MP1). If this condition is not met, the higher of the two outputs OUTP or OUTN is held high by parasitic capacitance and, over time, may be delayed in the causing of an error, because if either OUTP or OUTN is being held high by a voltage stored by a parasitic capacitance, any leakage current from the corresponding conductor (n1 or n2) may slowly change the voltage on that conductor and eventually cause an output error.

To illustrate this susceptibility, suppose that INP is at 2 volts and IN is at 0 volts. With these conditions transistor MP2 will be turned on and will pull OUTP to 2 volts. Next, suppose that INN ramps up to 1.8 volts and stays at 1.8 volts. As INN ramps up to 1.8 volts, parasitic effects will cause the voltage of conductor n2 to ramp up also. As conductor n2 ramps up, transistor MP2 will turn off. If there is any leakage current from OUTP to GND then the voltage of OUTP will discharge to a potential lower than 2 volts, possibly all the way down to 0 volts. Under these conditions the basic comparator of FIG. 1 cannot provide reliable operation.

FIG. 5 shows an improved version 20B of the basic comparator circuit 20A of FIG. 4 that has been obtained by adding P-channel cross-coupled pull-up transistors MP5 and MP6 to basic self-biased comparator circuit 20A. The source and bulk terminals of transistor MP5 are connected to INN and the source and bulk terminals of transistor MP6 are connected to INP. The gate of transistor MP5 is connected to the drain of transistor MP6 and OUTP. The gate of transistor MP6 is connected to the drain of transistor MP5 and to OUTN. The function of pull-up transistors MP5 and MP6 is to keep OUTP and OUTN at a correct voltage even when the difference between INP and INN is less than VTP. To illustrate the function of the pull-up transistors MP5 and MP6, assume the same scenario described above. That is, initially INP is at 2 volts and INN is at 0 volts. Under these conditions MP2 will be turned on and will pull OUTP to 2 volts. OUTN will be at 0 volts. Next, assume that INN ramps up to 1.8 volts and stays at that level. As INN ramps up to 1.8 volts, parasitic effects will cause node n2 to ramp up also. As node N2 ramps up MP2 will turn off. However, with the pull-up transistors MP5 and MP6 in place, the gate of MP6 will still be at 0 volts and its source will be at 2 volts. Pull-up transistor MP6 will therefore be turned on and will keep OUTP at 2 volts. Thus, it can be seen that the pull-up transistors MP5 and MP6 ensure that comparator 20B of FIG. 5 functions reliably even when the voltage difference between INP and INN is less than VTP.

FIG. 6 shows a comparator 20C which is a further improvement of the comparator circuit 20B of FIG. 5. In addition to the pull-up transistors MP5 and MP6 it also includes P-channel transistors MP7 and MP8. The gate of transistor MP7 is connected to INP, its source and bulk electrodes are connected to INN, and its drain is connected to OUTN. The gate of transistor MP8 is connected to INN, its source and bulk electrodes are connected to INP, and its drain is connected to OUTP. The function of transistors MP7 and MP8 is to enhance the start-up response of comparator 20C. In self-biased comparator circuit 20C of FIG. 6, the addition of transistors MP7 and 8 provides an "early definition" for the circuit when one of its inputs INP or INN ramps up before the other. For example, if INN is held at ground and INP is ramped up, since INN is connected to the gate of transistor MP8, the source of which is connected to INP, transistor MP8 turned on as soon as the voltage of INP exceeds the threshold voltage VTP of transistor MP8. That provides a conduction path to transistors MN1 and MN2 which causes the latch circuit formed by them to switch states consistently. Instead of relying on the parasitic capacitance on conductor n2 to hold it at ground so transistor MP2 turns on as INP ramps up and causes OUTP to follow INP, comparator 20C of FIG. 6 relies on INN being held at ground and transistor MP8 being turned on as INP increases to cause OUTP to follow INP. Thus, it can be seen that with MP7 and MP8 in place, transistors MP7 and MP8 function as the equivalent of a set input and a reset input of the latch. Therefore, comparator 20B is guaranteed to start-up as soon as the difference between INP and INN exceeds the P-channel threshold voltage VTP. It should be noted that the addition of transistors MP5, 6, 7, 8 2 the basic comparator 20A shown in FIG. 4 does not affect the hysteresis of the basic comparator.

Figure 9:
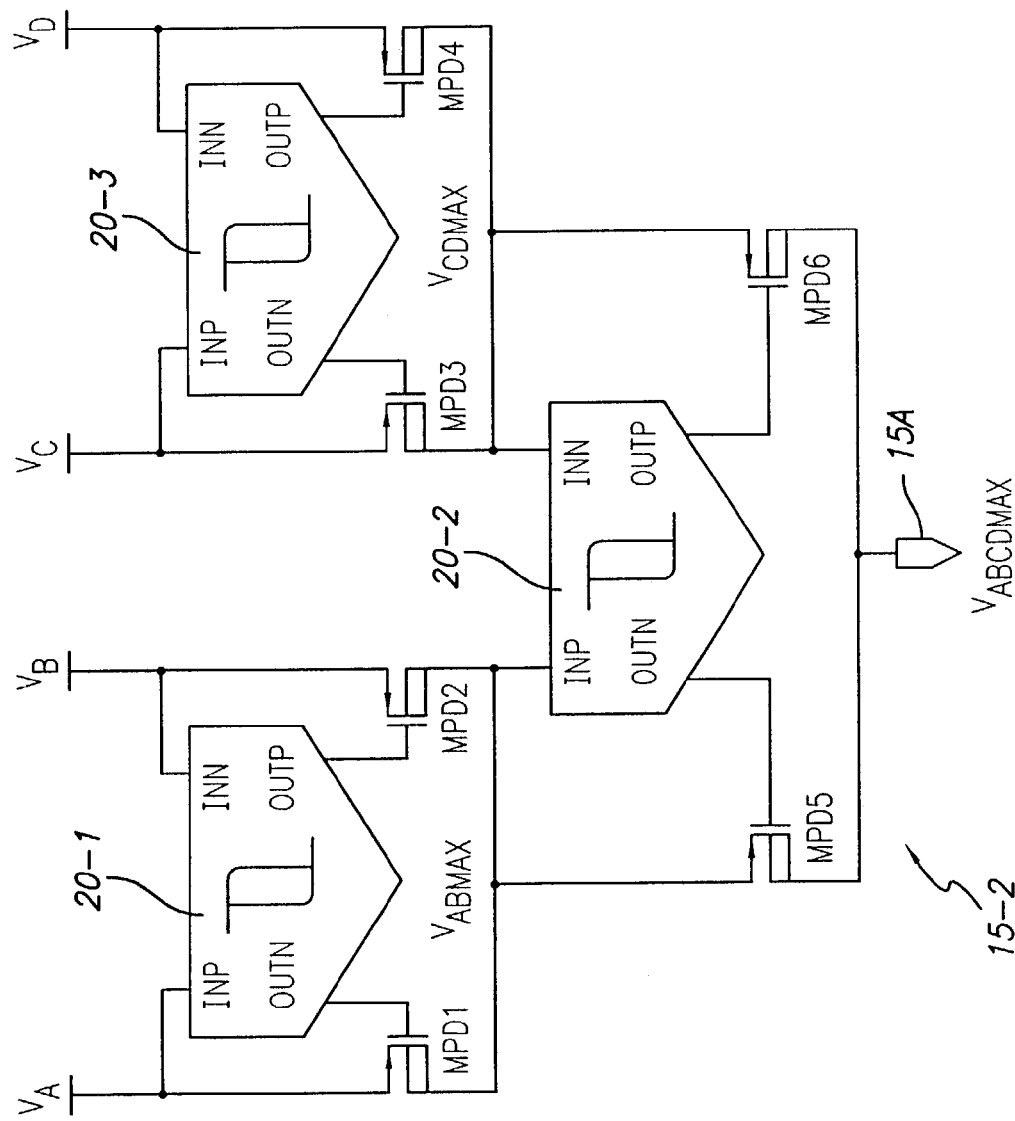
FIG. 9 is a diagram of a monitor circuit that produces an output voltage equal to the highest of 4 supply voltages.

Referring to FIG. 7, a power supply voltage monitor circuit 15-1 for selecting the higher of two voltages VA and VB can use any of the above described self-biased comparators 20A, 20B or 20C as its main building block. Although any one of the three disclosed comparators 20A, 20B and 20C (any one of which is referred to by reference numeral 20 in FIGS. 7–9) can be used, comparator 20C of FIG. 6 provides the most reliable operation. The input INP of comparator 20 is connected to supply voltage VA and to the source of a P-channel transistor MPD1. The output OUTN of comparator 20 is connected to the gate of transistor MPD1, the drain and bulk electrodes of which are connected to conductor 15A. Similarly, the input INN of comparator 20 is connected to supply voltage VB and to the source of a P-channel transistor MPD2. The output OUTP of comparator 20 is connected to the gate of a P-channel transistor MPD2, the drain and bulk electrodes of which are connected to conductor 15A.

Figure 10:
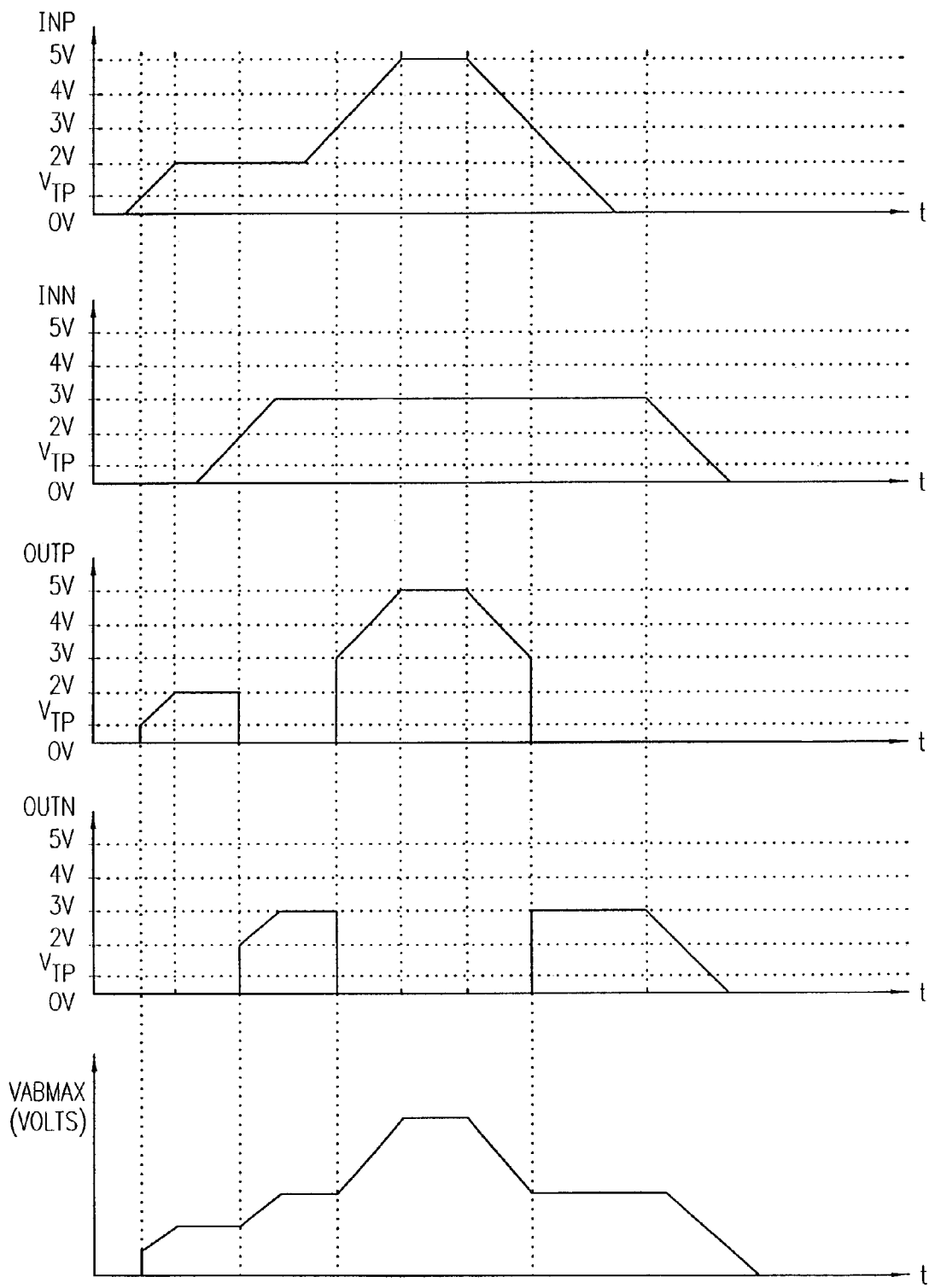
FIG. 10 is a timing diagram useful in explaining the operation of the basic self-biased comparator circuit of FIG. 4.

Monitor circuit 15-1 takes advantage of the characteristics of comparator 20 to selectively turn on one of the P-channel driver transistors MPD1 or MPD2. When supply voltage VA is larger than supply voltage VB, output OUTN is at 0 volts and output OUTP is at the same voltage as VA. Consequently, transistor MPD1 is turned on and transistor MPD2 is turned off and the resulting voltage VABMAX produced on output terminal 15A is at the same voltage as VA. Similarly, when supply voltage VB is larger than VA, output OUTP is at 0 volts and output OUTN is at the same level as supply voltage VB. Consequently, transistor MPD2 is turned on and transistor MPD1 is turned off and the voltage VABMAX produced on output terminal 15A is at the same potential as VB. The voltage VABMAX therefore follows the higher of the two power supply voltages VA and VB. FIG. 10 illustrates the operation of voltage monitor circuit 15-1, by showing waveforms for the output signals OUTP and OUTN and VABMAX for two hypothetical input waveforms for the input signals INP and INN.

Figure 1A:
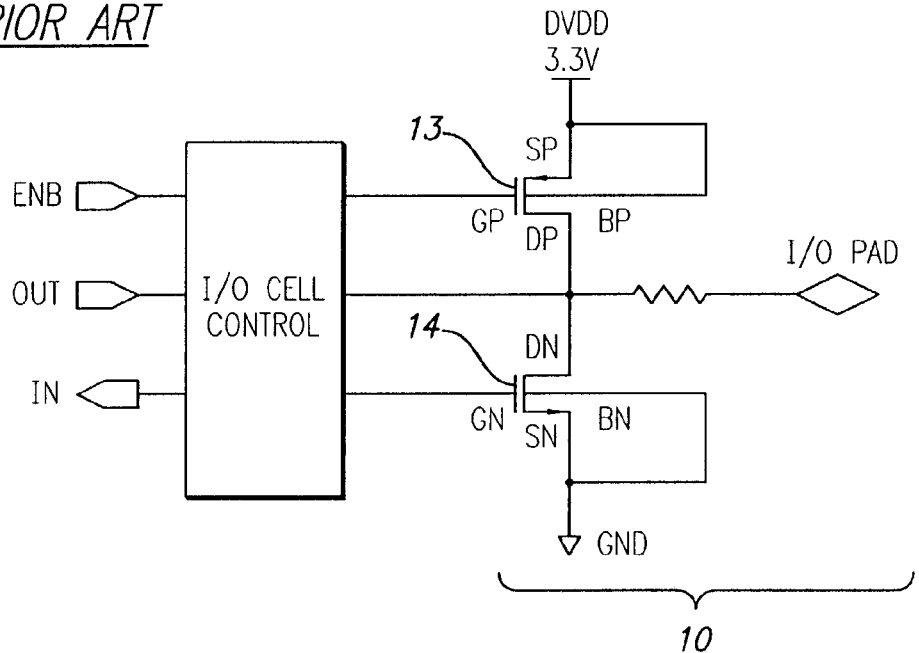
FIG. 1A is a schematic diagram of a prior art I/O cell powered by a digital supply voltage DVDD.
Figure 1B:
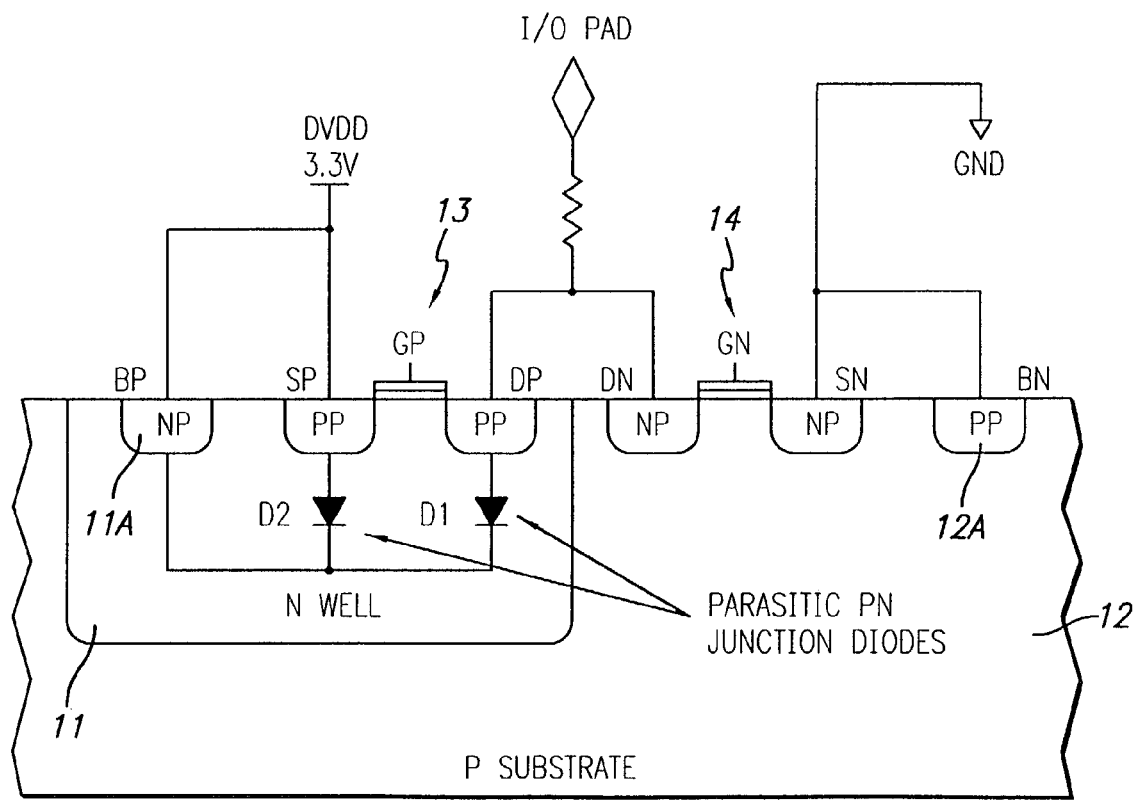
FIG. 1B is a sectional view of the structure of an integrated circuit implementation of the I/O cell in FIG. 1A.
Figure 1C:
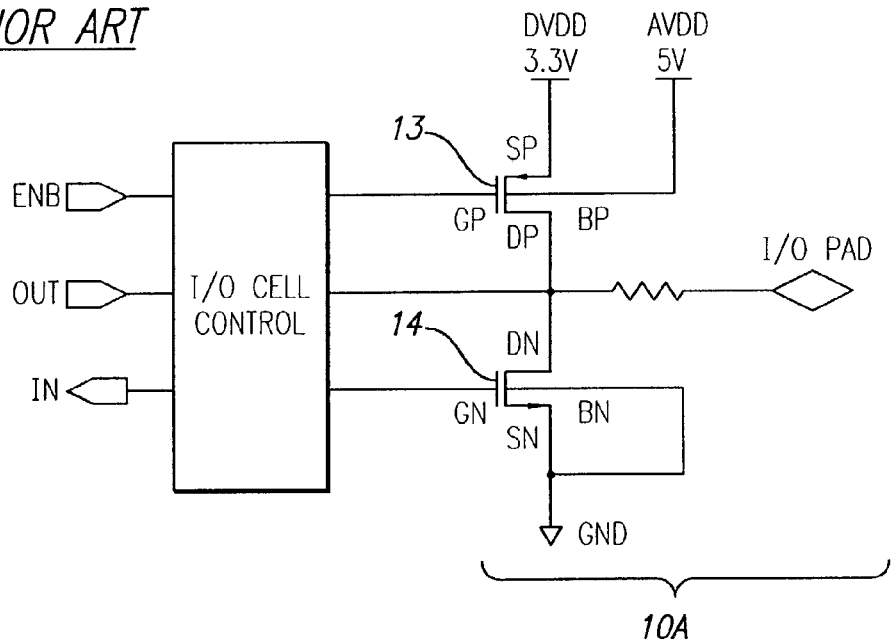
FIG. 1C is a schematic diagram of a prior art 10 cell powered by both a digital supply voltage DVDD and an analog supply voltage AVDD.
Figure 1D:
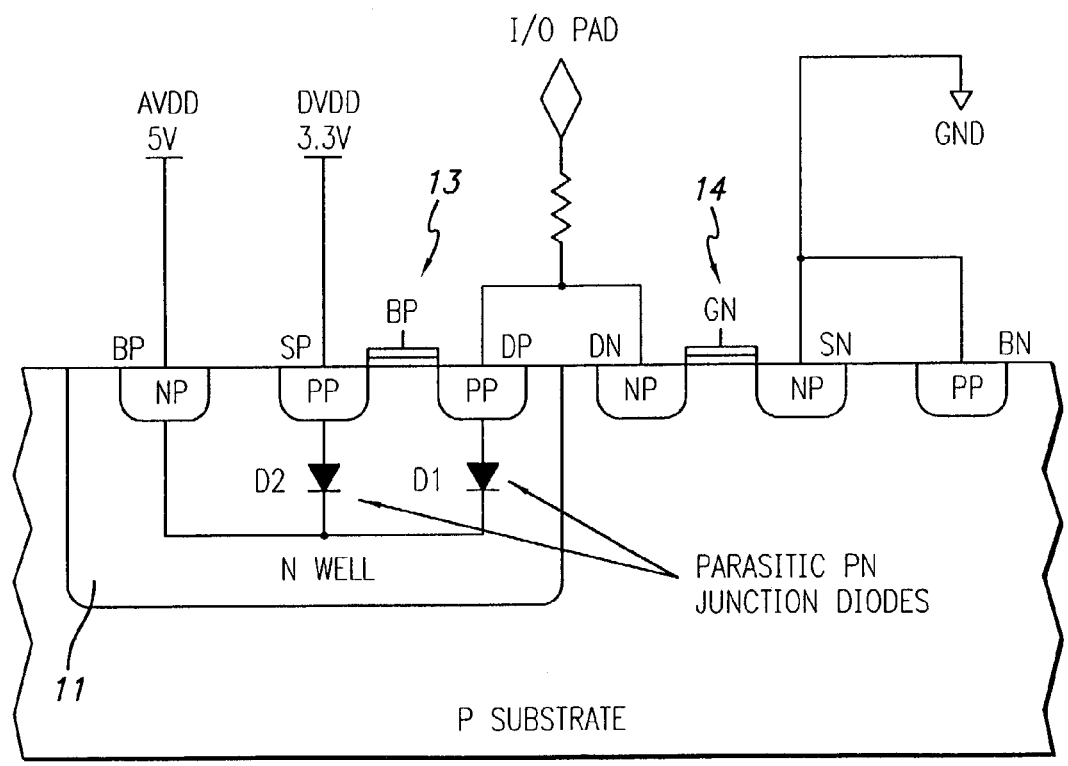
FIG. 1D is a sectional view of the structure of an integrated circuit implementation of the I/O cell in FIG. 1C.
Figure 1E:
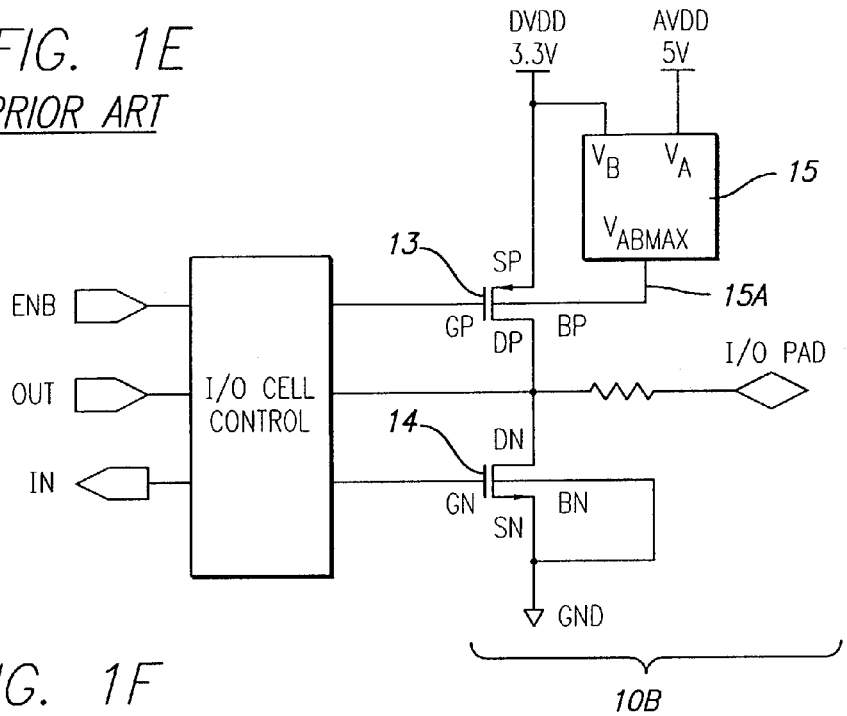
FIG. 1E is a schematic diagram of a prior art 10 cell powered by both a digital supply voltage DVDD and an analog supply voltage AVDD wherein in N-type well region is biased by a monitor circuit which applies the higher of the supply voltages DVDD and AVDD to the N-type well region.
Figure 1F:
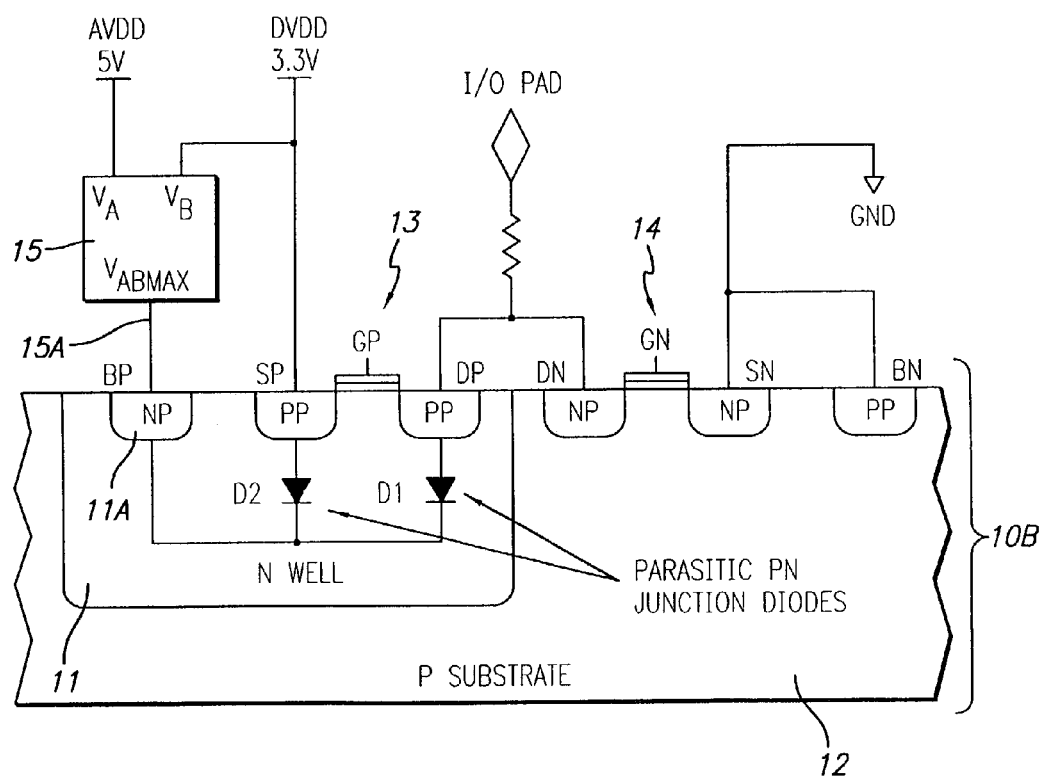
FIG. 1F is a hybrid sectional view of the monitor circuit and the structure of an integrated circuit implementation of the I/O cell in FIG. 1E.
Figure 2:
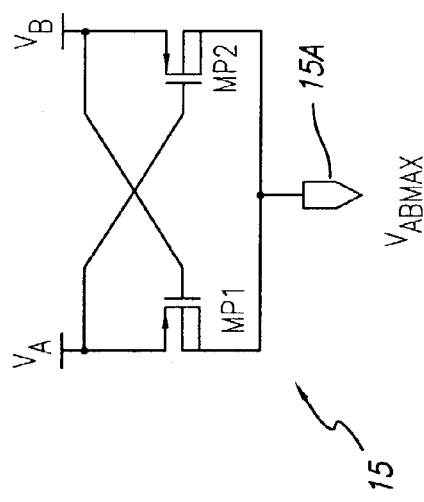
FIG. 2 is a schematic diagram of a prior art monitor circuit.
Figure 3:
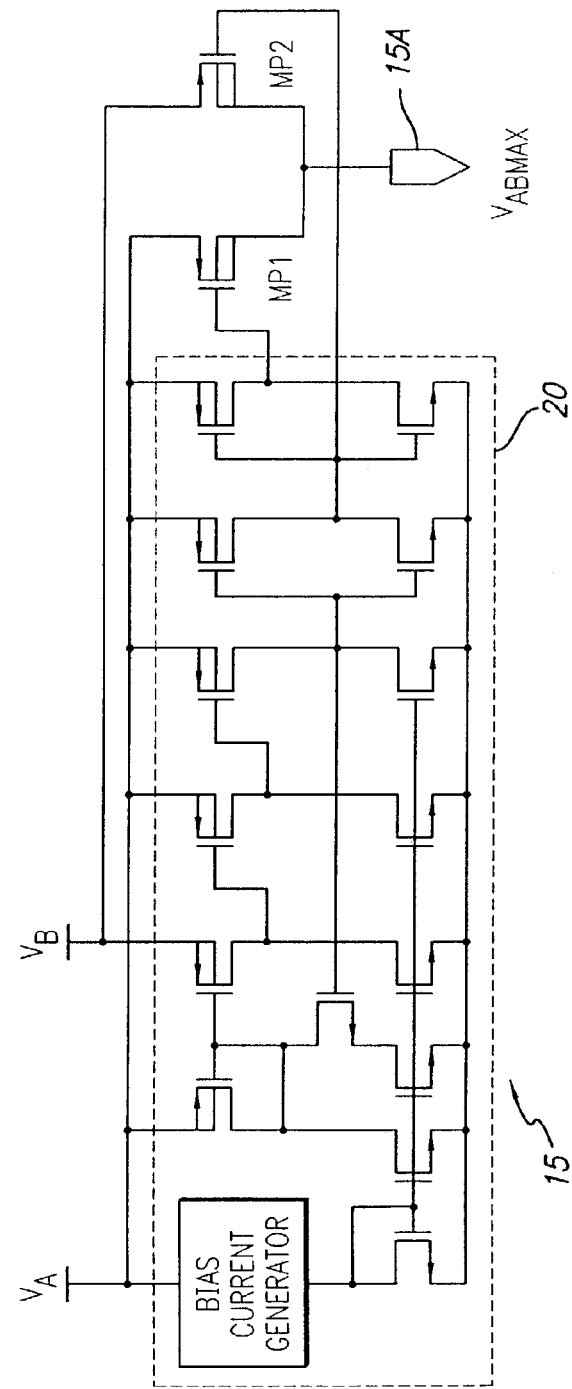
FIG. 3 is a schematic diagram of another prior art monitor circuit.

FIG. 8 shows the output voltage VABMAX of power supply monitor circuit 15-1 of FIG. 7 connected to I/O cell 10B of FIGS. 1E and 1F, with the analog power supply voltage AVDD and the digital power supply voltage DVDD being connected to the VA input and the VB input, respectively, of power supply monitor circuit 15-1. The output voltage VABMAX is connected by conductor 15A and heavily doped N-type contact region 11A to bias N-type well region 11 at VABMAX volts in order to prevent either of parasitic PN junction diodes D1 or D2 from becoming forward biased during transitions of the power supply voltages AVDD and DVDD. The N-type well region (not shown) in which P-channel driver transistors MPD1 and MPD2 are formed (i.e., the bulk electrodes of transistors MPD1 and MPD2) are connected the output terminal VABMAX to keep the that N-type well region at the higher of the AVDD and DVDD power supply voltages and thus prevent forward biasing of the parasitic PN junction diodes associated with transistors MPD1 and MPD2.

The functionality of the circuit of FIG. 7 for selecting the higher of two inputs can be expanded, within practical limits, to an arbitrary number of power supply voltage inputs. For example, by using three comparators 20-1, 20-2 and 20-3, the circuit of FIG. 8 compares four power supply input voltages VA, VB, VC, and VD and outputs the highest one as the voltage VABCDMAX on the output terminal 15A.

If a semiconductor manufacturing process is utilized that provides P-well regions, the substrate needs to be electrically coupled to the highest power supply voltage provided to the chip. The above described monitor circuit can also be utilized to operatively connect the N-type substrate used in such a manufacturing process to the highest power supply voltage.

Transistors MN3 and MN4 in the comparators described above perform the function of providing bias currents to transistors MP3 and MP4, respectively, and therefore could be replaced by suitable current sources or resistors. However, the hysteresis of the described comparators could not be as easily established by simply selecting the values of M and N as described above.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, diode-connected transistors MP3 and MP4 in FIGS. 4–6 function as level shifters, and the level shifting function can be performed by other level shifting devices or circuits, such as PN junction diodes or diode-connected N-channel transistors.

What is claimed is:

1. A self-biased comparator circuit comprising:
   (a) first and second inputs, first and second outputs and a reference voltage conductor;
   (b) first and second N-channel transistors and first and second current sources;
   (c) first, second, third and fourth P-channel transistors;
   (d) sources of the first and second N-channel transistors being coupled to the reference voltage conductor, a gate of the first N-channel transistor being coupled to the first output, a drain of the second N-channel transistor and a drain of the second P-channel transistor, a gate of the second N-channel transistor being coupled to the second output, a drain of the first N-channel transistor and a drain of the first P-channel transistor; and
   (e) a source and bulk electrode of the third P-channel transistor and a source and a bulk electrode of the second P-channel transistor being coupled to the first input, a source and a bulk electrode of the fourth P-channel transistor and a source and the bulk electrode of the first P-channel transistor being coupled to the second input, a first conductor being coupled to a gate of the first P-channel transistor, a gate and a drain of the third P-channel transistor, and a first terminal of the first current source, a second conductor being coupled to a gate of the second P-channel transistor, a gate and drain of the fourth P-channel transistor, and a first terminal of the second current source, a second terminal of the first current source and a second terminal of the second current source being coupled to the reference voltage conductor,
   wherein a channel-width-to-channel-length ratio of the first and second P-channel transistors is substantially greater than a channel-width-to-channel-length ratio of the third and fourth P-channel transistors.

2. The self-biased comparator circuit of claim 1 wherein the first current source includes a third N-channel transistor having a source coupled to the reference voltage conductor, a gate coupled to the first output and a drain coupled to the first conductor, and the second current source includes a fourth N-channel transistor having a source coupled to the reference voltage conductor, a gate coupled to the second output and a drain coupled to the second conductor.

3. The self-biased comparator circuit of claim 2 wherein a hysteresis of the self-biased comparator circuit is determined by the ratio of the channel-width-to-channel-length ratio of the first and third P-channel transistors to a channel-width-to-channel-length ratio of the first and third N-channel transistors.

4. A self-biased comparator circuit comprising:
   (a) first and second inputs, first and second outputs and a reference voltage conductor;
   (b) first and second N-channel transistors and first and second current sources;
   (c) first, second, third and fourth P-channel transistors;
   (d) sources of the first and second N-channel transistors being coupled to the reference voltage conductor, a gate of the first N-channel transistor being coupled to the first output, a drain of the second N-channel transistor and a drain of the second P-channel transistor, a gate of the second N-channel transistor being coupled to the second output, a drain of the first N-channel transistor and a drain of the first P-channel transistor;
   (e) a source and bulk electrode of the third P-channel transistor and a source and a bulk electrode of the second P-channel transistor being coupled to the first input, a source and a bulk electrode of the fourth P-channel transistor and a source and the bulk electrode of the first P-channel transistor being coupled to the second input, a first conductor being coupled to a gate of the first P-channel transistor, a gate and a drain of the third P-channel transistor, and a first terminal of the first current source, a second conductor being coupled to a gate of the second P-channel transistor, a gate and drain of the fourth P-channel transistor, and a first terminal of the second current source, a second terminal of the first current source and a second terminal of the second current source being coupled to the reference voltage conductor; and
   (f) a fifth P-channel transistor having a source coupled to the second input signal, a drain coupled to the second output, and a gate coupled to the first output, and a sixth P-channel transistor having a source coupled to the first input signal, a drain coupled to the first output, and a gate coupled to the second output.

5. A self-biased comparator circuit comprising:
   (a) first and second inputs, first and second outputs and a reference voltage conductor;
   (b) first and second N-channel transistors and first and second current sources;
   (c) first, second, third and fourth P-channel transistors;
   (d) sources of the first and second N-channel transistors being coupled to the reference voltage conductor, a gate of the first N-channel transistor being coupled to the first output, a drain of the second N-channel transistor and a drain of the second P-channel transistor, a gate of the second N-channel transistor being coupled to the second output, a drain of the first N-channel transistor and a drain of the first P-channel transistor;
   (e) a source and bulk electrode of the third P-channel transistor and a source and a bulk electrode of the second P-channel transistor being coupled to the first input, a source and a bulk electrode of the fourth P-channel transistor and a source and the bulk electrode of the first P-channel transistor being coupled to the second input, a first conductor being coupled to a gate of the first P-channel transistor, a gate and a drain of the third P-channel transistor, and a first terminal of the first current source, a second conductor being coupled to a gate of the second P-channel transistor, a gate and drain of the fourth P-channel transistor, and a first terminal of the second current source, a second terminal of the first current source and a second terminal of the second current source being coupled to the reference voltage conductor; and
   (f) a fifth P-channel transistor having a source coupled to the second input signal, a drain coupled to the second output, and a gate coupled to the first output, and a sixth P-channel transistor having a source coupled to the first input signal, a drain coupled to the first output, and a gate coupled to the second output, a seventh P-channel transistor having a source coupled to the second input signal, a drain coupled to the second output, and a gate coupled to the first input signal, and an eighth P-channel transistor having a source coupled to the first input signal, a drain coupled to the first output, and a gate coupled to the second input signal.

6. A voltage monitor circuit comprising:
   (a) a first voltage input, a second voltage input, and a voltage output;

(b) a self-biased comparator circuit including
  i. first and second inputs, first and second outputs and a reference voltage conductor,
  ii. first and second N-channel transistors and first and second current sources,
  iii. first, second, third and fourth P-channel transistors,
  iv. sources of the first and second N-channel transistors being coupled to the reference voltage conductor, a gate of the first N-channel transistor being coupled to the first output, a drain of the second N-channel transistor and a drain of the second P-channel transistor, a gate of the second N-channel transistor being coupled to the second output, a drain of the first N-channel transistor and a drain of the first P-channel transistor, and
  v. a source and bulk electrode of the third P-channel transistor and a source and a bulk electrode of the second P-channel transistor being coupled to the first input, a source and a bulk electrode of the fourth P-channel transistor and a source and the bulk electrode of the first P-channel transistor being coupled to the second input, a first conductor being coupled to a gate of the first P-channel transistor, a gate and a drain of the third P-channel transistor, and a first terminal of the first current source, a second conductor being coupled to a gate of the second P-channel transistor, a gate and drain of the fourth P-channel transistor, and a first terminal of the second current source, a second terminal of the first current source and a second terminal of the second current source being coupled to the reference voltage conductor;
(c) a first P-channel drive transistor having a source coupled to the first voltage input and the first input, a gate coupled to the second output, and a source and a bulk electrode coupled to the voltage output; and
(d) a second P-channel drive transistor having a source coupled to the second voltage input and the second input, a gate coupled to the first output, and a source and a bulk electrode coupled to the voltage output,
wherein the output voltage is equal to the greater of the first and second voltage inputs, and
wherein a channel-width-to-channel-length ratio of the first and second P-channel transistors is substantially greater than a channel-width-to-channel-length ratio of the third and fourth P-channel transistors.

7. The voltage monitor circuit of claim 6 wherein the first current source includes a third N-channel transistor having a source coupled to the reference voltage conductor, a gate coupled to the first output and a drain coupled to the first conductor, and a fourth N-channel transistor having a source coupled to the reference voltage conductor, a gate coupled to the second output and a drain coupled to the second conductor.

8. The voltage monitor circuit of claim 7 wherein a hysteresis of the self-biased comparator circuit is determined by the ratio of the channel-width-to-channel-length ratio of the first and third P-channel transistors to a channel-width-to-channel-length ratio of the first and third N-channel transistors.

9. A voltage monitor circuit comprising:
(a) a first voltage input, a second voltage input, and a voltage output;
(b) a self-biased comparator circuit including
  i. first and second inputs, first and second outputs and a reference voltage conductor,
  ii. first and second N-channel transistors and first and second current sources,
  iii. first, second, third and fourth P-channel transistors,
  iv. sources of the first and second N-channel transistors being coupled to the reference voltage conductor, a gate of the first N-channel transistor being coupled to the first output, a drain of the second N-channel transistor and a drain of the second P-channel transistor, a gate of the second N-channel transistor being coupled to the second output, a drain of the first N-channel transistor and a drain of the first P-channel transistor, and
  v. a source and bulk electrode of the third P-channel transistor and a source and a bulk electrode of the second P-channel transistor being coupled to the first input, a source and a bulk electrode of the fourth P-channel transistor and a source and the bulk electrode of the first P-channel transistor being coupled to the second input, a first conductor being coupled to a gate of the first P-channel transistor, a gate and a drain of the third P-channel transistor, and a first terminal of the first current source, a second conductor being coupled to a gate of the second P-channel transistor, a gate and drain of the fourth P-channel transistor, and a first terminal of the second current source, a second terminal of the first current source and a second terminal of the second current source being coupled to the reference voltage conductor;
(c) a first P-channel drive transistor having a source coupled to the first voltage input and the first input, a gate coupled to the second output, and a source and a bulk electrode coupled to the voltage output and
(d) a second P-channel drive transistor having a source coupled to the second voltage input and the second input, a gate coupled to the first output, and a source and a bulk electrode coupled to the voltage output,
wherein the output voltage is equal to the greater of the first and second voltage inputs, and
wherein said self-biased comparator further comprises a fifth P-channel transistor having a source coupled to the second input signal, a drain coupled to the second output, and a gate coupled to the first output, and a sixth P-channel transistor having a source coupled to the first input signal, a drain coupled to the first output, and a gate coupled to the second output.

10. A voltage monitor circuit comprising:
(a) a first voltage input, a second voltage input, and a voltage output;
(b) a self-biased comparator circuit including
  i. first and second inputs, first and second outputs and a reference voltage conductor,
  ii. first and second N-channel transistors and first and second current sources,
  iii. first, second, third and fourth P-channel transistors,
  iv. sources of the first and second N-channel transistors being coupled to the reference voltage conductor, a gate of the first N-channel transistor being coupled to the first output, a drain of the second N-channel transistor and a drain of the second P-channel transistor, a gate of the second N-channel transistor being coupled to the second output, a drain of the first N-channel transistor and a drain of the first P-channel transistor, and
  v. a source and bulk electrode of the third P-channel transistor and a source and a bulk electrode of the second P-channel transistor being coupled to the first input, a source and a bulk electrode of the fourth P-channel transistor and a source and the bulk electrode of the first P-channel transistor being coupled to the second input, a first conductor being coupled to a gate of the first P-channel transistor, a gate and a drain of the third P-channel transistor, and a first terminal of the first current source, a second conductor being coupled to a gate of the second P-channel transistor, a gate and drain of the fourth P-channel transistor, and a first terminal of the second current source, a second terminal of the first current source and a second terminal of the second current source being coupled to the reference voltage conductor;

(c) a first P-channel drive transistor having a source coupled to the first voltage input and the first input, a gate coupled to the second output, and a source and a bulk electrode coupled to the voltage output; and (d) a second P-channel drive transistor having a source coupled to the second voltage input and the second input, a gate coupled to the first output, and a source and a bulk electrode coupled to the voltage output, wherein the output voltage is equal to the greater of the first and second voltage inputs, and a fifth P-channel transistor having a source coupled to the second input signal, a drain coupled to the second output, and a gate coupled to the first output, and a sixth P-channel transistor having a source coupled to the first input signal, a drain coupled to the first output, and a gate coupled to the second output, a seventh P-channel transistor having a source coupled to the second input signal, a drain coupled to the second output, and a gate coupled to the first input signal, and an eighth P-channel transistor having a source coupled to the first input signal, a drain coupled to the first output, and a gate coupled to the second input signal.

11. A CMOS integrated circuit which avoids forward biasing of parasitic PN junctions, comprising:

(a) first and second supply voltage inputs, an N-type well region in which a P-type region is formed, the P-type region being coupled to receive a voltage that exceeds the voltage of one of the first and second supply voltage inputs;

(b) a voltage monitor circuit having a first voltage input coupled to the first supply voltage input, a second voltage input coupled to the second supply voltage input, and a voltage output, the voltage monitor circuit including a self-biased comparator circuit including i. first and second inputs, first and second outputs and a reference voltage conductor, ii. first and second N-channel transistors and first and second current sources;

iii. first, second, third and fourth P-channel transistors, iv. sources of the first and second N-channel transistors being coupled to the reference voltage conductor, a gate of the first N-channel transistor being coupled to the first output, a drain of the second N-channel transistor and a drain of the second P-channel transistor, a gate of the second N-channel transistor being coupled to the second output, a drain of the first N-channel transistor and a drain of the first P-channel transistor, and v. a source and bulk electrode of the third P-channel transistor and a source and a bulk electrode of the second P-channel transistor being coupled to the first input, a source and a bulk electrode of the fourth P-channel transistor and a source and the bulk electrode of the first P-channel transistor being coupled to the second input, a first conductor being coupled to a gate of the first P-channel transistor, a gate and a drain of the third P-channel transistor, and a first terminal of the first current source, a second conductor being coupled to a gate of the second P-channel transistor, a gate and drain of the fourth P-channel transistor, and a first terminal of the second current source, a second terminal of the first current source and a second terminal of the second current source being coupled to the reference voltage conductor;

(c) a first P-channel drive transistor having a source coupled to the first voltage input and the first input, a gate coupled to the second output, and a source and a bulk electrode coupled to the voltage output; and (d) a second P-channel drive transistor having a source coupled to the second voltage input and the second input, a gate coupled to the first output, and a source and a bulk electrode coupled to the voltage output, wherein the output voltage is equal to the greater of the first and second voltage inputs, and wherein a channel-width-to-channel-length ratio of the first and second P-channel transistors is substantially greater than a channel-width-to-channel-length ratio of the third and fourth P-channel transistors.

12. The CMOS integrated circuit of claim 11 wherein the first current source includes a third N-channel transistor having a source coupled to the reference voltage conductor, a gate coupled to the first output and a drain coupled to the first conductor, and a fourth N-channel transistor having a source coupled to the reference voltage conductor, a gate coupled to the second output and a drain coupled to the second conductor, and wherein a hysteresis of the self-biased comparator circuit is determined by the ratio of the channel-width-to-channel-length ratio of the first and third P-channel transistors to a channel-width-to-channel-length ratio of the first and third N-channel transistors.

13. A CMOS integrated circuit which avoids forward biasing of parasitic PN junctions, comprising:

(a) first and second supply voltage inputs, an N-type well region in which a P-type region is formed, the P-type region being coupled to receive a voltage that exceeds the voltage of one of the first and second supply voltage inputs;

(b) a voltage monitor circuit having a first voltage input coupled to the first supply voltage input, a second voltage input coupled to the second supply voltage input, and a voltage output, the voltage monitor circuit including a self-biased comparator circuit including i. first and second inputs, first and second outputs and a reference voltage conductor, ii. first and second N-channel transistors and first and second current sources;

iii. first, second, third and fourth P-channel transistors, iv. sources of the first and second N-channel transistors being coupled to the reference voltage conductor, a gate of the first N-channel transistor being coupled to the first output, a drain of the second N-channel transistor and a drain of the second P-channel transistor, a gate of the second N-channel transistor being coupled to the second output, a drain of the first N-channel transistor and a drain of the first P-channel transistor, and v. a source and bulk electrode of the third P-channel transistor and a source and a bulk electrode of the second P-channel transistor being coupled to the first input, a source and a bulk electrode of the fourth P-channel transistor and a source and the bulk electrode of the first P-channel transistor being coupled to the second input, a first conductor being coupled to a gate of the first P-channel transistor, a gate and a drain of the third P-channel transistor, and a first terminal of the first current source, a second conductor being coupled to a gate of the second P-channel transistor, a gate and drain of the fourth P-channel transistor, and a first terminal of the second current source, a second terminal of the first current source and a second terminal of the second current source being coupled to the reference voltage conductor;

(c) a first P-channel drive transistor having a source coupled to the first voltage input and the first input, a gate coupled to the second output, and a source and a bulk electrode coupled to the voltage output; and (d) a second P-channel drive transistor having a source coupled to the second voltage input and the second input, a gate coupled to the first output, and a source and a bulk electrode coupled to the voltage output, wherein the output voltage is equal to the greater of the first and second voltage inputs, and wherein said self-biased comparator further includes a fifth P-channel transistor having a source coupled to the second input signal, a drain coupled to the second output, and a gate coupled to the first output, and a sixth P-channel transistor having a source coupled to the first input signal, a drain coupled to the first output, and a gate coupled to the second output.

14. A CMOS integrated circuit which avoids forward biasing of parasitic PN junctions, comprising:

(a) first and second supply voltage inputs, an N-type well region in which a P-type region is formed, the P-type region being coupled to receive a voltage that exceeds the voltage of one of the first and second supply voltage inputs;

(b) a voltage monitor circuit having a first voltage input coupled to the first supply voltage input, a second voltage input coupled to the second supply voltage input, and a voltage output, the voltage monitor circuit including a self-biased comparator circuit including
  i. first and second inputs, first and second outputs and a reference voltage conductor,
  ii. first and second N-channel transistors and first and second current sources;
  iii. first, second, third and fourth P-channel transistors,
  iv. sources of the first and second N-channel transistors being coupled to the reference voltage conductor, a gate of the first N-channel transistor being coupled to the first output, a drain of the second N-channel transistor and a drain of the second P-channel transistor, a gate of the second N-channel transistor being coupled to the second output, a drain of the first N-channel transistor and a drain of the first P-channel transistor, and
  v. a source and bulk electrode of the third P-channel transistor and a source and a bulk electrode of the second P-channel transistor being coupled to the first input, a source and a bulk electrode of the fourth P-channel transistor and a source and the bulk electrode of the first P-channel transistor being coupled to the second input, a first conductor being coupled to a gate of the first P-channel transistor, a gate and a drain of the third P-channel transistor, and a first terminal of the first current source, a second conductor being coupled to a gate of the second P-channel transistor, a gate and drain of the fourth P-channel transistor, and a first terminal of the second current source, a second terminal of the first current source and a second terminal of the second current source being coupled to the reference voltage conductor;

(c) a first P-channel drive transistor having a source coupled to the first voltage input and the first input, a gate coupled to the second output, and a source and a bulk electrode coupled to the voltage output; and (d) a second P-channel drive transistor having a source coupled to the second voltage input and the second input, a gate coupled to the first output, and a source and a bulk electrode coupled to the voltage output, wherein the output voltage is equal to the greater of the first and second voltage inputs, and wherein said self-biased comparator further includes including a fifth P-channel transistor having a source coupled to the second input signal, a drain coupled to the second output, and a gate coupled to the first output, and a sixth P-channel transistor having a source coupled to the first input signal, a drain coupled to the first output, and a gate coupled to the second output, a seventh P-channel transistor having a source coupled to the second input signal, a drain coupled to the second output, and a gate coupled to the first input signal, and an eighth P-channel transistor having a source coupled to the first input signal, a drain coupled to the first output, and a gate coupled to the second input signal.

* * * * *